United States Patent [19]

Nasibov et al.

[11] Patent Number: 5,317,583
[45] Date of Patent: May 31, 1994

[54] SEMICONDUCTOR LASER SCREEN OF A CATHODE-RAY TUBE

[75] Inventors: Alexander S. Nasibov; Pavel V. Reznikov, both of Moscow Oblast, Russian Federation

[73] Assignees: Principia Optics Incorporated, Los Angeles, Calif.; P.N. Lebedev Institute of Physics, Moscow, Russian Federation

[21] Appl. No.: 875,824

[22] Filed: Apr. 30, 1992

[30] Foreign Application Priority Data

Dec. 26, 1991 [RU] Russian Federation .... N5016150/21

[51] Int. Cl.$^5$ ................................................. H01S 3/19
[52] U.S. Cl. ........................................... 372/43; 372/45
[58] Field of Search .............................. 372/43, 45, 74

[56] References Cited

U.S. PATENT DOCUMENTS 4,539,687  9/1985  Gordon et al. ..................... 372/43
5,081,632  1/1992  Migita et al. ....................... 372/45

Primary Examiner—Georgia Y. Epps
Attorney, Agent, or Firm—Marshall A. Lerner

[57] ABSTRACT

A laser screen of a cathode-ray tube has a semiconductor member made of a semiconductor material selected from the group consisting of an $A^{II}B^{VI}$ compound or a solid solution of an $A^{II}B^{VI}$ compound and a pair of mirror layers formed on the opposite sides of said semiconductor member. The material of the semiconductor member is doped with a donor impurity in the form of an element of the VII Group of the Periodic Table. A content of the donor impurity ranges from $3 \cdot 10^{17}$ to $5 \cdot 10^{18}$ cm$^{-3}$, and the resistivity of the semiconductor member is maximum $10^{-1}$ $\Omega$/cm.

18 Claims, 2 Drawing Sheets

SEMICONDUCTOR LASER SCREEN OF A CATHODE-RAY TUBE

FIELD OF THE INVENTION

The invention relates to electronic equipment and, more particularly, to a semiconductor laser screen for a cathode-ray tube. The invention may be used in projection TV systems, in optical scanning devices, photolithography, computer engineering and in other fields where indicator devices are used.

BACKGROUND OF THE INVENTION

A prior art laser screen comprises a semiconductor member having reflecting coatings which form an optical cavity. The semiconductor member, which is an active component of the laser screen, consists of two parts: an active part made of a narrow gap $A^{II}B^{VI}$ compound and a passive part made of a wider gap $A^{II}B^{VI}$ compound (Katsap, V. N. et. al. Heterostructures $CdS_xSe_{1-x}/CdS_x$ in Lasers with Longitudinal Electron Beam Pumping (in Russian). J. Kvantovaya Elektronika. Moscow. 1987. Vol. 14. No. 10. pp. 1994–1997). The use of an $A^{II}B^{VI}$ compound having a greater gap width allows absorption in the passive area at the generation wavelength to be lowered. It is very difficult to make this device with an adequate efficiency because centers of non-emitting recombination are formed and lasing efficiency is rather low (3% at 300 K.).

Another prior art laser screen for a cathode-ray tube has a single-crystal active semiconductor member of an $A^{II}B^{VI}$ compound with a content of non-controlled impurities of maximum $10^{17}$ cm$^{-3}$. A resistivity of $CdS_{1-x}Se_x$ single-crystals ranges from $10^4$ to $10^5$ $\Omega$/cm and a resistivity of ZnSe single crystals and single-crystal platelets CdS and $CdS_{1-x}Se_x$ is higher than $10^6$ $\Omega$/cm.

When such laser screen is excited with an electron beam, a radiation in a visible, ultraviolet or infrared range is generated depending on composition of an $A^{II}B^{VI}$ compound used (Ulasyuk, V. N. Kvantoskopy [Laser Screen Cathode-Ray Tubes] (in Russian). Moscow. J. "Radio i Svyaz" Publishing House. 1988. pp. 137, 138). This laser screen is deficient in having a low generation efficiency of 10% at 80 K. and 3% at 300 K. and high threshold current. Cooling of the laser screen is needed in practical applications.

This can be explained on the one hand by the fact that a part of non-equilibrium carriers excited with an electron beam recombine without emission because of the presence of centers of non-emitting recombination which are formed during growth of the semiconductor material when the laser screen is made and also during operation and which are available on the surface. The ratio of emitting to non-emitting recombined carriers depends on the ratio of the emitting lifetime of non-equilibrium carriers to the non-emitting lifetime.

On the other hand, non-uniformity of excitation, which is inherent in lasers with longitudinal electron beam pumping, results in the generated radiation being absorbed in the non-excited area of the semiconductor. Both effects become more pronounced when working temperature of the laser screen increases.

SUMMARY OF THE INVENTION

It is an object of the invention to provide a semiconductor member of a laser screen which is capable of decreasing the ratio of the emitting lifetime of non-equilibrium carriers to the non-emitting lifetime.

Another object of the invention is to enhance lasing efficiency and lower generation threshold.

Among other objects is to enhance efficiency of emitting recombination and lower absorption in the non-excited area at high working temperatures of a laser screen.

These and other objects are accomplished by the fact that a laser screen has a semiconductor member in an optical cavity which is made of an $A^{II}B^{VI}$ compound doped with a donor impurity of an element of the VII Group of the Periodic System. The content of this impurity ranges from at least $3\cdot10^{17}$ to about $5\cdot10^{18}$ cm$^{-3}$. The resistivity of the semiconductor member is maximum $10^{-1}$ $\Omega$/cm.

The presence of various residual impurities in semiconductor wafers of $A^{II}B^{VI}$ compounds is known, but their content does not exceed $10^{17}$ cm$^{-3}$ (by chemical analysis). A resistivity ranges from about $10^4$ to about $10^6$ $\Omega$/cm. This resistivity attests to the fact that a donor impurity is compensated for by its own point defects. The compensating defects form complexes with impurities and these complexes act as non-emitting centers which substantially reduce efficiency of laser transitions.

The doping concentrations according to the invention reduce the emission recombination lifetime of non-equilibrium carriers in the presence of donors.

A decrease in the emission recombination lifetime results in an increase in the proportion of emitting recombined non-equilibrium carriers. This causes a decrease in generation threshold and enhances lasing efficiency. The choice of the type of a doping impurity between donors and acceptors is determined by the fact that acceptors in $A^{II}B^{VI}$ compounds have an ionization energy ranging from about 0.1 to about 0.2 eV which is substantially greater than that of the donors having the same range from about 0.015 to 0.030 eV. The choice of donors of the VII Group is explained by the fact that donors of the III Group such as Al and Ga when used in concentrations higher than $10^{17}$ cm$^{-3}$ tend to form clusters of defects which are centers of non-emitting recombination. With a concentration of donors of the VII Group below $3\cdot10^{17}$ cm$^{-3}$ no substantial advantage is obtained in a competition between emitting and non-emitting transitions since the emission lifetime is roughly inversely proportional to the donor concentration. With a donor concentration is excess of $5\cdot10^{18}$ cm$^{-3}$ an increase occurs in the number of complexes containing a donor impurity and inherent point defects which act as non-emitting centers. A resistivity above $10^{-1}$ $\Omega$/cm means that a substantial proportion of donors are compensated for by point defects. The compensation causes a decrease in the number of active donors, and the compensating point defects act as centers of non-emitting recombination.

It will be understood from the above that a useful result can be achieved only with doping with an impurity of the VII Group of the Periodic System in the range from at least $3\cdot10^{17}$ to about $5\cdot10^{18}$ cm$^{-3}$ and a resistivity of maximum $10^{-1}$ $\Omega$/cm.

DESCRIPTION OF THE DRAWINGS

The invention will now be described in detail with reference to specific non-limiting embodiments illustrated in the accompanying drawings, in which identical details are shown at identical reference numerals and in which.

DESCRIPTION OF PREFERRED EMBODIMENTS

Figure 1:
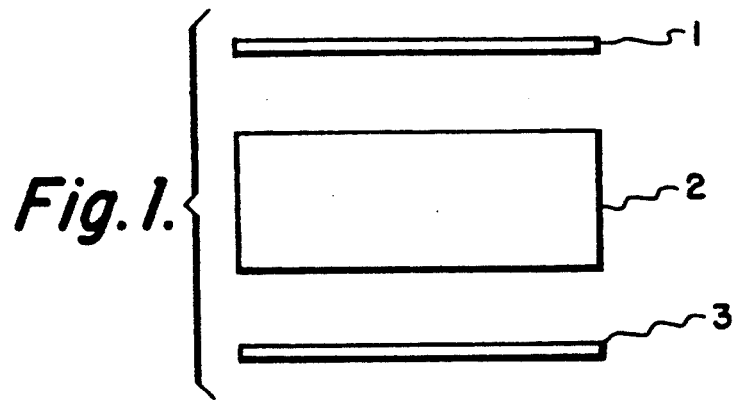
FIG. 1 schematically shows a sectional view of a laser.

With reference to FIG. 1, a semiconductor laser member 2 is shown in an optical cavity consisting of mirror 1 and mirror 3. The semiconductor member 2 is selected from the group consisting of an $A^{II}B^{VI}$ compound or a solid solution of an $A^{II}B^{VI}$ compound. At least part of semiconductor member 2 consists of material doped with a donor impurity. Semiconductor member 2 may be a binary semiconductor compound such as, CdS, CdSe, CdTe, ZnS, ZnSe, ZnTe, ZnO, formed from a solid solution of compounds such as CdSSe, ZnSSe, CdZnS, CdZnSe, CdZnSSe, ZnMgO, ZnMgS, CdHgTe, and so on. Semiconductor member 2 may be constructed from variable concentration compounds such as $Cd_xZn_{1-x}S_ySe_{1-y}$ where x and y are greater than or equal to zero and smaller or equal to 1, (with variable band gap). The general case of $A^1_{1-x}A^2_x B_{1-y}^1 B^2_y$ ($0<=x<=1$, $0<=y<=1$) can be tailored for a particular wavelength of interest. In this case, it is preferable that the part of member 2 having lesser band gap is placed in excited area (shown below). This permits decreasing of losses of the generative emission inside the optical cavity and increasing of output light power.

An excess metallic component may be used to produce n-type conductivity of the semiconductor member. For example, excess Zn in ZnO located in intersites is a donor. Elements of the III Group of the Periodic System may be used as donor impurities. But it is preferable to use for these purposes elements of VII Group of the Periodic System, because of improved electrical activity. Donor impurities may be Cl, Br, I,F.

It is preferable that the concentration of this impurity ranges from at least $3 \cdot 10^{17}$ to about $5 \cdot 10^{18}$ cm$^{-3}$ and the resistivity of the semiconductor member is maximum $10^{-1}$ Ω/cm.

Thus using a doping material for semiconductor member provides increased efficiency of emitting recombination of non-equilibrium carriers and enhances the characteristics and properties of semiconductor lasers.

Another advantage of using a doping semiconductor member is, that it decreases losses of generating emission inside an optical cavity outside the excited (active) region. This is very important for semiconductor lasers with nonuniform excitations.

Figure 2:
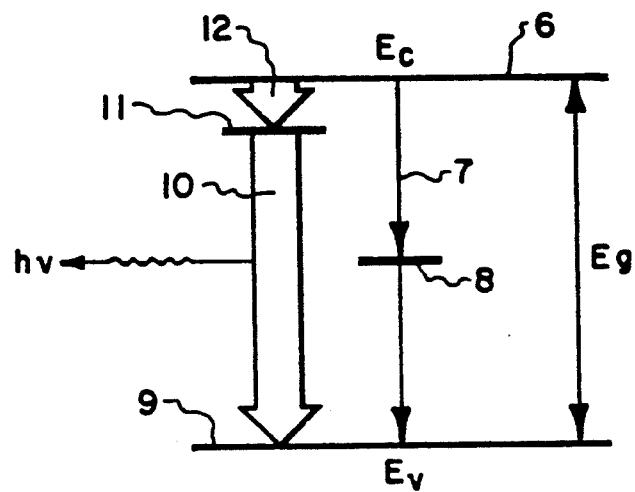
FIG. 2 schematically shows excitation of lasing with doping according to the invention.
Figure 3:
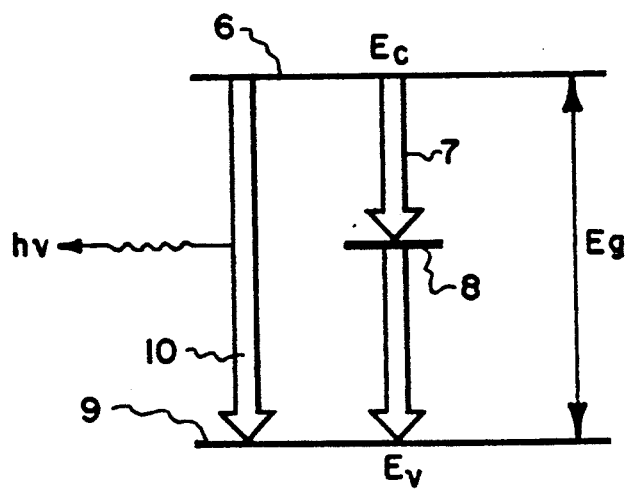
FIG. 3 schematically shows excitation of lasing without doping.

The general concept of how lasing occurs is explained with reference to FIGS. 2 and 3 in which the following details are shown at the following reference numerals: a conduction band $E_c$ is shown at 6, non-emitting transitions are at 7, a position of deep levels is shown at 8. Reference numeral 9 is for a valence band $E_v$, 10 shows active lasing transitions, 11 is for a position of a donor level, and 12 shows a non-emitting transition between the conduction band and the donor level. Emission is shown at "hv" and $E_g$ denotes the energy gap. Non-equilibrium carriers excited by electron beam may recombine with or without lasing. The number of carriers which recombine without lasing depends on concentration of non-emitting recombination centers and cross-sectional area within which non-emitting recombination centers would capture these carriers. It should be, however, noted that with the same number and type of non-emitting recombination centers in non-doped and doped semiconductor members the proportion of emitting recombined carriers is greater in the latter case owing to a higher rate of emitting recombination with participation of donors. The rates of emitting and non-emitting transitions in FIGS. 2 and 3 are about proportional to thickness of arrows showing respective transitions. In addition, energy of light quanta radiated through donor states is lower in a doped semiconductor member in comparison with quantum energy of direct transitions of a non-doped semiconductor member with a difference of about the amount of energy of ionization of donors. This results in the absorption of generated radiation being lower in the non-excited or weakly excited parts of the crystal. The generated radiation is known to be absorbed in the non-excited or weakly excited parts of the undoped crystal. This is explained by non-uniformity of excitation inherent in electron beam excited lasers. In the case where all semiconductor material in the optical cavity is uniformly doped, the semiconductor emits light from band edge to band edge energy difference at the excited region but at the nonexcited region the minimum radiation energy required for direct absorption is higher (Burestein effect) and hence absorption is reduced.

Figure 4:
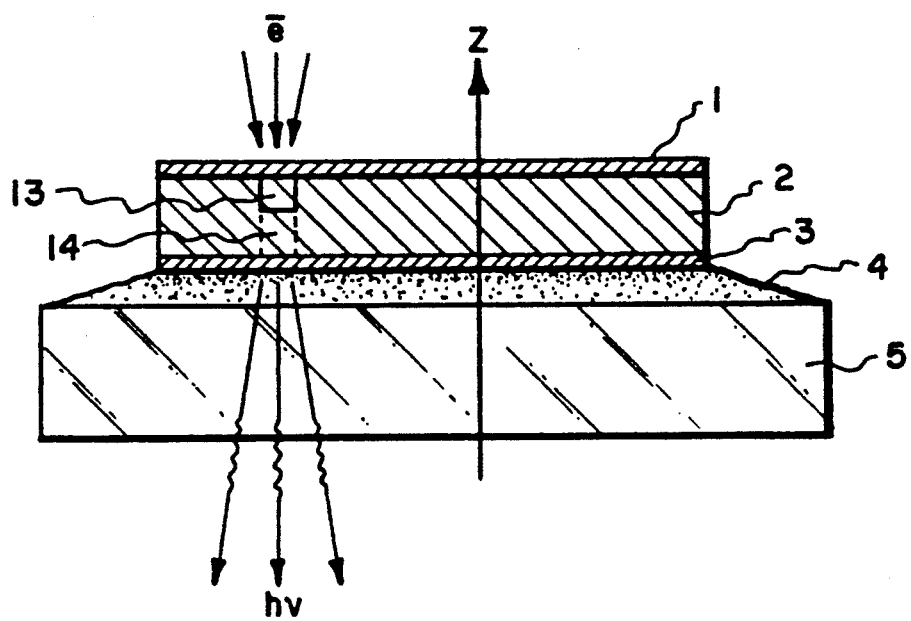
FIG. 4 schematically shows a sectional view of a semiconductor laser screen of a cathode ray tube.

Most practical devices based on $A^{II}B^{VI}$ semiconductor laser are excited heterogeneous nonuniformity. Optical excitation or excitation by electron beam or by electrical breakdown discharge are usually used. The most interesting application of $A^{II}B^{VI}$ semiconductor laser is a laser screen of a cathode-ray tube, the longitudinal pump laser screen shown on FIG. 4. A semiconductor member is employed as a layer 2 having a thickness from 1 μm to 150 μm placed between reflecting mirror 1 and partly transparent mirror 3. Support member 5 is connected to partly transparent mirror 3 by connecting layer 4. A sharp focusing electron beam is usually used. In this case excitation is not uniform both along a cavity axis and across this axis. A gain is appeared under excitation and a generation of electromagnetic emission is generated in the excitation area 13. Using a doped semiconductor member 2 allows for a decrease of losses of generating emission inside the passive area 14 (nonexcited or partially excited). The diameter and energy of the electron beam usually ranges from 10 to 200 μm and from 20 to 100 keV, respectively. It is preferable that the thickness of semiconductor member 2 be at least the penetration depth of the electron beam and not exceed more than ten times this depth. The thickness of member 2 is at least 1 μm because the penetration depth of a 20 keV electron beam is about 1 μm and has a maximum of 150 μm because the penetration depth of 100 keV electron beam is about 15 μm. If the thickness of member 2 is smaller than the penetration depth the effectiveness of the laser decreases. If the thickness of semiconductor member 2 is more than ten times the penetration depth, the effectiveness of the laser is also decreased.

It should be noted that if the semiconductor member is not doped or the thickness of the semiconductor layer is as large as ten times the penetration depth, the effectiveness of the semiconductor laser working at room temperature is small because of strong absorption of generation emission inside the passive areas of the cavity. Therefore, to use a semiconductor layer with a thickness approximately equal to the penetration depth would decrease the life time of the laser screen.

Figure 5:
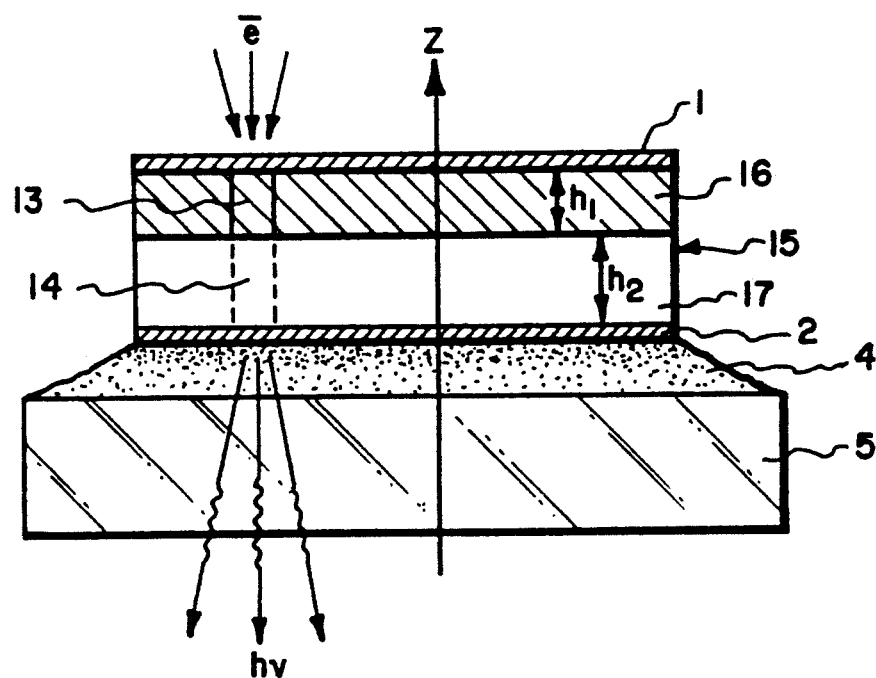
FIG. 5 schematically shows another embodiment of semiconductor laser screen.

For additional decreasing of absorption of generation emission inside the cavity it is preferable to dope only an excited part of a semiconductor member. This embodiment is shown on FIG. 5.

Semiconductor member 15 consists of a doped part 16 and an undoped part 17. The thickness $h_1$ of the doped part 16 ranges from 1 to 15 $\mu$m under excitation of electron beam with electron energy of 20 to 100 keV, and thickness $h_2$ of undoped part 17 ranges from 0 to about 0.5 mm.

In this case a passive area 14 is undoped and the excited area 13 is doped. Using an undoped passive area and a doped active (excited) area permits a decrease of the absorption of generation emission inside an optical cavity because the free-carrier absorption taking place in the doped layer disappears. Part 17 is equal to approximately the entire thickness of semiconductor member 15 and may be increased up to 0.5 mm. This limitation is due to increasing diffraction losses appearing with a large cavity length.

It should be also noted that it is preferable to use an undoped part 17 with a variable band gap, this gap increasing from doped layer 13 to mirror 2. It is possible to use the entire semiconductor member having a variable gap. However, the gap variation of the excited area must not be more than the width of the gain line of uniform semiconductor, that is not more than about 0.1 keV, otherwise the threshold of generation will increase. Other embodiments of the laser screen has a semiconductor member 15 being a heterostructure with doped part 16 and undoped or doped part 17, this part 17 having larger gap than the gap of part 16.

Enlargement in the spot size is limited by the value $\approx 200$ $\mu$m and this is connected with the effects of the light amplification in the direction transverse to the cavity axis. In this case when the size of the e-beam spot is more than 200 $\mu$m the semiconductor member 15 must be cut on the cells with sizes approximately $200 \times 200$ $\mu$m. The interval between cells may be filled with high absorption matter.

The doped semiconductor member may be used in semiconductor lasers with transverse electron beam pumping.

A laser screen of cathode-ray tube with uniform semiconductor member from ZnSe:I may be manufactured by the following manner.

At the first step an epitaxial ZnSe:I layer or GaAs substrate may be prepared by a low pressure MOVPE system by the method described in the article N. Shibata, A. Ohki and A. Katsui, "Iodine-doped low-resistivity n-type ZnSe films grown by MOVPE," J. of Crystal Growth, 1988, Vol. 93, p. 703. The MOVPE system consistes of a vertical cold-wall reactor containing an SiC-coated graphite susceptor heated by a conventional RF furnace. Diethylzine and H$_2$Se are used as source materials for Zn and Se, respectively. Highly purified ethyliodine source is supplied from individual stainless-steel bubbles. The flow rate of the alkyliodide is controlled by a mass flow controller and the bubbles' temperature. The flow rate of diethylzine is 7.4 $\mu$mol/min. The molar ratio of H$_2$Se to diethylzine ranges from 5 to 50. The total hydrogen flow rate is 2 l/min. The growth temperature range is 235° to 450° C. Growth is carried out at a pressure of 40 Torr.

ZnSe layers are grown on Cr-doped semi-insulating (100) GaAs (p > 10$^7$Ω cm) substrates. Prior to growth, the substrates are chemically etched in a H$_2$SO—H$_2$O$_2$—H$_2$O 5:1:1 mixture, followed by etching in 10% Br methanol. A final heat treatment is performed at 550° C. for 10 minutes under a hydrogen gas flow in the reactor.

The I-doped ZnSe layer of 10 $\mu$m thickness may be grown by this method. Then a mirror coating consisting of nine quarter-wave layers of SiO$_2$ and ZrO$_2$ is sputtered to the grown surface of the ZnSe layer. The side of layer is cemented to the support made as usually from sapphire by using optical transparency epoxy such as OK-72F (Russian name).

Then GaAs-substrate is etched out in a H$_2$SO$_4$—H$_2$O$_2$—H$_2$O 5:1:1 mixture. A metallic mirror is sputtered to exposed surface of the ZnSe layer.

For manufacturing a laser screen consists of undoped and doped parts of the semiconductor member. The first, a doped ZnSe part with 5 $\mu$m thickness may be prepared by the above mentioned growing method and the undoped ZnSe part with 10 $\mu$m thickness be prepared. Other steps are the same.

It is clear that many other known methods may be used for manufacturing a laser screen. Indeed, a semiconductor member may be prepared from a single-crystal bulk (ingot) grown vapor or liquid phases. In this case the single-crystal ingot is sliced on several wafers. A wafer is polished mechanically and chemically and then is doped by ion implantation, followed annealing, or by gas phase diffusion in atmosphere of one of the elements of VII Group of the Periodic System.

Except for an epitaxial growing method described above in detail, many other known methods may be used such as MOCVD, MBE growingtechnologies, a method of laser or electron beam sputtering, or a hot-wall growing method, and so on.

It should also be noted that all parts of laser screens may be produced by epitaxial growth technology like the one used for semiconductor laser with a multiple layer A$^{II}$B$^{VI}$ structure as in an article Koyama F., et al., GaAlAs/GaAs MOCVD Growth for Surface Emitting Laser. Jap. J of Appl. Phys., 1987, Vol. 26, pp. 1077-1081.

In this case at the first step a buffer layer is grown on transparent substrate, after that multiple-layer mirror, undoped and doped layers are grown and at last a second multiple-layer mirror are grown. It should be understood that all layers are single-crystalline.

Tests of semiconductor members made of materials with different doping concentrations have been carried out as described in specific illustrative examples that follow.

EXAMPLE 1

A semiconductor member was made in the form of a wafer of a semiconductor compound ZnSe doped with iodine to a concentration of $2 \cdot 10^{18}$ cm$^{-3}$ which has a resistivity of 0.0015 Ω/cm. The material having these characteristics may be prepared by the MOVPE growth technique at a temperature of maximum 350° C.

The wafer was 50 mm in diameter and 0.04 mm thick and had a reflecting silver coating on one side and a partly transparent mirror coating having a reflectivity of 0.9 on the other side. The wafer was cemented to a transparent heat removing sapphire support 60 mm in diameter and 12 mm thick.

This laser screen was used in a cathode-ray tube with an electron beam with an energy of electrons of 75 keV and a current of 0.5 mA. The beam was focused into a spot of 15 $\mu$m and was scanned over the semiconductor member at a speed of $10^5$ cm/s.

Lasing efficiency at radiation wavelengths of 450 and 470 $\mu$m, respectively, was 20% and 7% and a generation threshold was 10 $\mu$A and 30 $\mu$A at a support temperature of 80 K. and 300 K., respectively.

EXAMPLE 2

A semiconductor member was made as described in Example 1, but wafer had two parts. The first part was as in example 1 with a thickness of 15 $\mu$m. The second part was undoped and placed between the first part and the partially transparent mirror and its thickness was 40 $\mu$m.

Lasing efficiency was 18% and 9% and a generation threshold was 15 $\mu$A and 40 $\mu$A at a support temperature of 80 K. and 300 K. respectively.

EXAMPLE 3

A semiconductor member was made as described in Example 1, but the material was not doped. Resistivity was of $10^6$ $\Omega$/cm.

Lasing efficiency was 3% and 1% and a generation threshold was 30 $\mu$A and 70 $\mu$A at a support temperature of 80 K. and 300 K. respectively.

As it can be seen from the examples, the laser screen threshold value is lower in comparison with a screen in which doping was not used. At the same time, lasing efficiency with doping was 6 to 7 times as high. This ensures a higher brightness of image on the screen which is very important for projection TV systems.

Non-limiting preferred embodiments of the invention have been described above. It is understood that various modifications and supplements may be made by those skilled in the art which do not go beyond the spirit and scope of the invention as defined in the attached claims.

We claim:

1. A laser screen comprising:
   a pair of mirrors; and
   a semiconductor member positioned between the two mirrors of said pair of mirrors, said semiconductor member being made of a material selected from the group consisting of an $A^{II}B^{VI}$ compound whereby the semiconductor material is doped with a donor impurity.

2. The invention of claim 1, wherein said semiconductor member consists of a binary semiconductor compound from the group comprising CdS, CdSe, CdTe, ZnS, ZnSe, ZnTe, ZnO.

3. The invention of claim 1, wherein said semiconductor member consists of a solid solution of $A^{II}B^{VI}$ compound from the group comprising CdSSe, ZnSSe, CdZnS, CdZnSe, CdZnSSe, ZnMgO, ZnMgS, CdHgTe.

4. The invention of claim 1, wherein said semiconductor member is made of variable composition compound $A^1_{1-x}A^2_xB^1_{1-y}B^2_y$ ($0<=x<=1$, $0<=y<=1$).

5. The invention of claim 4, wherein the excited volume of said semiconductor member has a smaller band gap than that of the unexcited volume.

6. The invention of claim 1, wherein said donor impurity is selected from Group VII of the Periodic Table consisting of Cl, Br, I, F.

7. The invention of claim 1, wherein the concentration of said donor impurity ranges from at least $3 \cdot 10^{17}$ to about $5 \cdot 10^{18}$ cm$^{-3}$ and the resistivity of said semiconductor member is a maximum of $10^{-1}$ $\Omega$/cm.

8. The invention of claim 1, wherein said semiconductor member has one doped layer and one undoped layer.

9. The invention of claim 8 and further comprising a laser screen for a cathode ray tube wherein said laser structure is excited by the electron beam and said laser structure is connected to a transparent heat conducting support.

10. The invention of claim 1, wherein said semiconductor member is planar and said mirrors are coated on the opposite sides of said semiconductor.

11. The invention of claim 1, wherein said semiconductor member has one doped layer and one undoped layer and said semiconductor member is excited by an electron beam.

12. The invention described in claim 11 and further comprising a laser screen for a cathode ray tube wherein said laser structure is excited by the electron beam and said laser structure is connected to a transparent heat conducting support.

13. The invention of claim 11, wherein the thickness of said doped part ranges from 1 $\mu$m to 15 $\mu$m.

14. The invention of claim 11, wherein the thickness said undoped part is a maximum of 0.5 mm.

15. The invention of claim 8, wherein said undoped part has a variable band gap.

16. The invention of claim 8, wherein said undoped part has a large band gap with respect to the band gap of the doped part.

17. The invention of claim 10, wherein said semiconductor member has a variable band gap.

18. The invention of claim 17, wherein an alteration of band gap of the doped part is a maximum of 0.1 eV.

* * * * *